Figure 1:
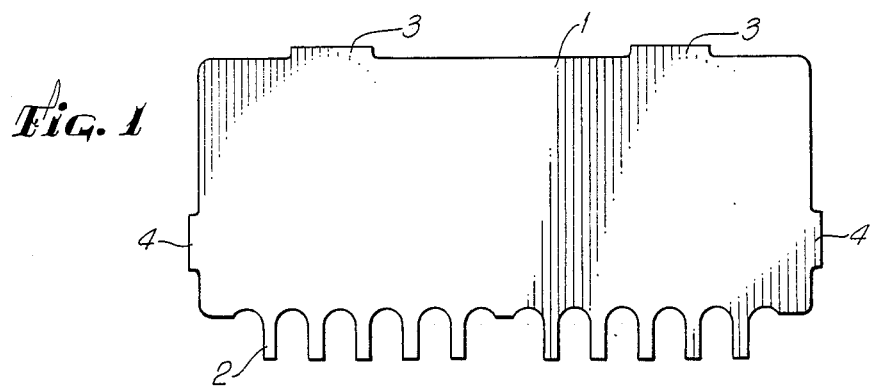

United States Patent [19]

Väisänen

[11] Patent Number: 4,912,604
[45] Date of Patent: Mar. 27, 1990

[54] RF-SHIELDED HYBRID CIRCUIT

[75] Inventor: Risto Väisänen, Salo, Finland

[73] Assignee: Nokia-Mobira Oy, Salo, Finland

[21] Appl. No.: 234,398

[22] Filed: Aug. 19, 1988

[30] Foreign Application Priority Data

Aug. 21, 1987 [FI] Finland .................................. 873619

[51] Int. Cl.$^4$ .............................................. H05K 9/00
[52] U.S. Cl. .................................... 361/424; 206/328;
361/220; 361/395
[58] Field of Search .............. 174/35 R, 35 C, 35 GC,
174/51; 206/328, 334; 361/212, 220, 395, 399,
380, 414, 424

[56] References Cited

U.S. PATENT DOCUMENTS

| | | | |
|---|---|---|---|
| 4,386,388 | 5/1983 | Beun | 361/395 |
| 4,401,351 | 8/1983 | Record | 361/395 |
| 4,415,983 | 11/1983 | Lachmann | 361/395 |
| 4,494,095 | 1/1985 | Noji | 361/399 |
| 4,739,453 | 4/1988 | Kurokawa | 361/424 |
| 4,811,165 | 3/1989 | Currier | 361/395 |

Primary Examiner—Gerald P. Tolin
Attorney, Agent, or Firm—Spensley Horn Jubas & Lubitz

[57] ABSTRACT

The invention relates to an RF-shielded hybrid circuit which comprises a printed circuit board (1) of an insulating material, with foils on both sides, components placed on one side of the printed circuit board, and an RF-shield housing (5) made of metal sheet and fitted around at least part of the circuit. It is the object of the invention to provide an RF-shield which can be manufactured automatically and which at the same time ensures a relatively simple and compact structure. In order to achieve this, the RF-shield for the circuit is made up on the one hand of a cup-like cover (5) the peripheral area of which extends substantially around the edge of the printed circuit board (1), with the exception of the area of the connectors (2) of the printed circuit board, and which is placed over the components, and on the other hand of an earth foil (2a) which faces away from the components of the printed circuit board and is soldered by its edge to the peripheral area (5a) of the cover (5).

10 Claims, 2 Drawing Sheets

RF-SHIELDED HYBRID CIRCUIT

The present invention relates to an RF-shielded hybrid circuit which comprises a printed circuit board of an insulating material, with foils on both sides, components placed on one side of the printed circuit board, and an RF-shield housing, formed of a metal sheet and fitted around at least part of the circuit.

It is previously known to form an RF-shield for hybrid circuits by fitting substantially around the whole circuit a profiled housing made of metal sheet, which is secured by mechanical means to the printed circuit board itself. The metal sheet housing may be assembled by, for example, spot welding. As electronics components are becoming less and less expensive owing to advanced manufacturing techniques, it is evident that a mechanical structure such as this, requiring several manufacturing steps, unreasonably increases the price of the circuit. Furthermore, since the housing must envelope the printed circuit board itself and its components, the total structure also becomes considerably large. It is, of course, possible to automate the manufacture of the shield housing to a rather high degree, but securing it to the printed circuit board itself is more cumbersome. Furthermore, since the housing extends around the entire board, the final assembly of the housing must not be done until after the printed circuit board with its components has been placed between the halves of the housing.

It is the object of the present invention to eliminate these disadvantages and to provide an RF-shield which makes the manufacture of the entire hybrid circuit simpler than previously and which at the same time ensures a sturdy but considerably small-sized structure and good RF-shielding. In order to achieve this, the invention is characterized in that the RF-shield of the circuit is made up jointly on the one hand of a cup-like cover, the peripheral area of which extends substantially around the edge of the printed circuit board, with the exception of the ara of the connectors of the printed circuit board, and which is placed over the components, and on the other hand of an earth foil facing away from the components of the printed circuit board, the foil being soldered by its edge to the peripheral area of the cover. In this manner a very compact and sturdy structure is obtained, and the printed circuit board itself can be secured to the cup-like part by, for example, automatic soldering, whereby at the same time a closed shield housing is formed, one side of it being formed by the earth foil of the circuit.

In the peripheral area of the shielding cup or cover there are preferably a number of notches, the depth of which corresponds to the thickness of the printed circuit board and with which the corresponding projections in the printed circuit board will mate in order to determine the position of the printed circuit board in relation to the cover.

Figure 2:
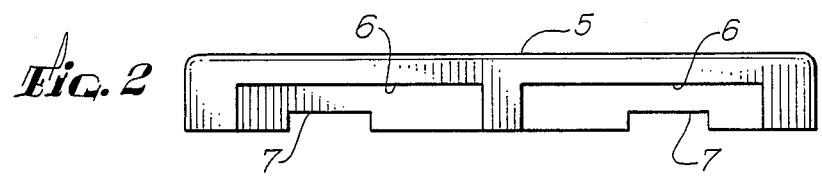
Figure 3:
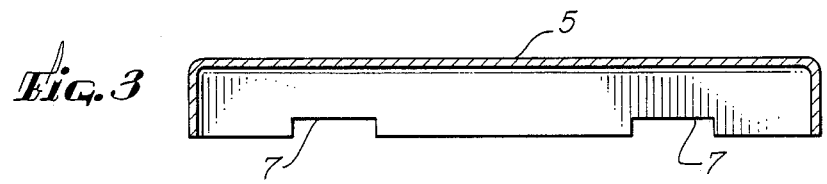
Figure 4:
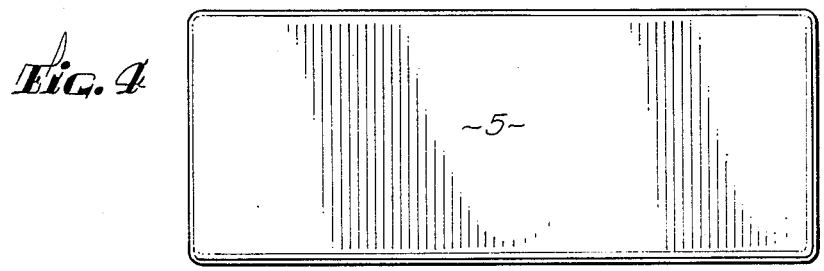
Figure 5:
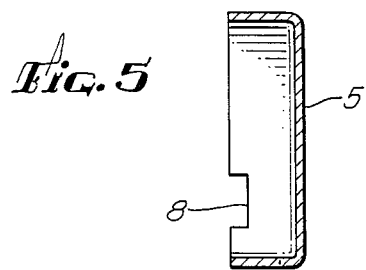
Figure 6:
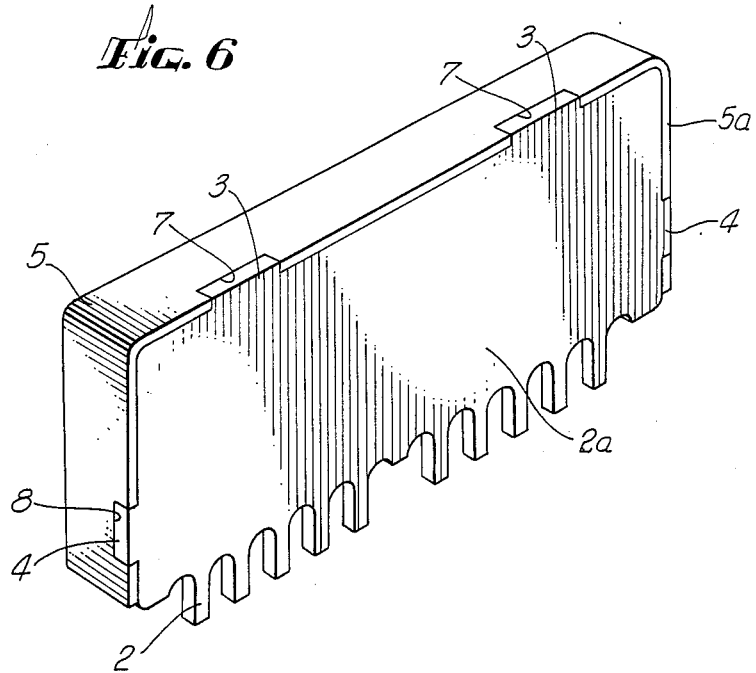
Figure 7:
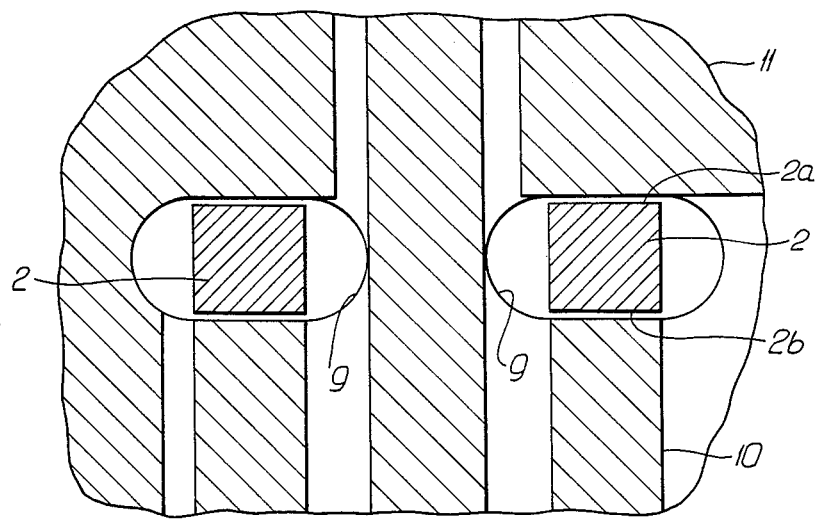

The invention and its other characteristics and advantages will be described below in greater detail in the form of an example and with reference to the accompanying drawings, in which FIG. 1 depicts a diagrammatic front view of the printed circuit board itself, FIG. 2 depicts the metal cover, as seen from below, FIG. 3 depicts a section of the metal cover, as seen from below, FIG. 4 depicts the metal cover, as seen directly from the side, FIG. 5 depicts the metal cover, sectioned and seen from the end, FIG. 6 is a perspective representation of the entire RF-shielded hybrid circuit, and FIG. 7 depicts the connecting of the printed circuit board to the mother board.

FIG. 1 thus shows the printed circuit board itself, which is, in a known manner, made of an insulating material and provided on one side with an earth foil and on the other side with conductor foils, as will be explained below. The printed circuit board has legs 2 which have been made of the material of the board by drilling holes close to the edge of the board and by grinding off the extra parts, whereupon the inner parts of the legs will be rounded. In the upper edge and ends of the printed circuit board there are additionally small protrusions 3 and 4, which serve to determine the position of the printed circuit board in relation to the shielding cover.

The shielding cover is shown in greater detail in FIGS. 2-5. It is preferably made of metal sheet by stamping it into the correct shape, whereafter notches 6 for the legs 2 are made in the edges of the cover and notches 7 for the protrusions 3, and notches 8 for the protrusions 4. The notches 6 made for the legs are deeper than the others, so that the legs 2 will not touch the edges of the notches 6.

FIG. 6 is a perspective representation of a finished RF-shielded hybrid circuit. The cover 5 is placed on top of the printed circuit board on its component side so that the protrusions 3 engage the notches 7 and the protrusions 4 engage the notches 8, whereby the mutual position of the board 1 and the cover 5 is determined precisely and the circuit is positioned at the correct depth in relation to the cover. Thereafter the printed circuit board and the cover can be interconnected automatically, even by solder dipping, since the entire back side of the printed circuit board is made up of the earth foil 2a, the edges of which will thereby be soldered to the edge of the cover 5 and will at the same time form one wall of the housing.

FIG. 7 finally shows how such a hybrid circuit can be suitably connected to the mother board. The legs 2 of the hybrid circuit have on one side the earth foil 2a and on the other side at least one conductor foil 2b. In the mother board there are respectively apertures 9, which correspond in width to the legs 2 of the circuit and are preferably oval and at their edges rounded. This simplifies the making of the apertures. The legs 2 are connected electrically to the foils of the mother board, by soldering on the straight sides of the apertures 9. Since the earth foil extends continuously down along the legs 2 all the way to the mother board, and symmetrically in relation to the conductor strips on the other side, a maximally good and at the same time simple RF-shield is obtained. It is, however, clear that the legs can also be of a different material than the printed circuit board and be secured to it mechanically in a suitable manner.

I claim:

1. An RF-shielded hybrid board which comprises a printed circuit board of an insulating material, said printed circuit board having connectors at at least one edge thereof, and foils provided on both sides of said printed circuit board, the foil on one side of said printed circuit board forming a continuous earth foil sheet, components placed on that side of said printed circuit board, opposite to said earth foil sheet and fitted around at least part of said printed circuit board a cup-like cover of metal sheet, said cup-like cover extending over said components and having a peripheral area which extends substantially around the edge of said printed circuit board, with the exception of the area of said connectors in said printed circuit board, said earth foil being soldered along its edge to said peripheral area of said cup-like cover, wherein said earth foil and said cup-like cover thus form a metallic RF-shield substantially enclosing said components.

2. A hybrid circuit according to claim 1, wherein at least one edge of said peripheral area of said cup-like cover is provided with two or more notches which mate with corresponding protrusions in said printed circuit board in order to fix the position of said printed circuit board in relation to said cup-like cover.

3. A hybrid circuit according to claim 1, wherein the area of said connectors a notch is provided in said peripheral area of said cup-like cover, the depth of the notch exceeding the thickness of said printed circuit board.

4. A hybrid circuit according to claim 3, wherein said connectors of said printed circuit board comprise projections in said edge of said printed circuit board, said projections extending beyond said cup-like cover and having each on one side said earth foil.

5. An RF-shielded hybrid board which comprises:
a printed circuit board of insulating material having electrical components on one side of the board and a foil on the other side forming a continuous earth foil; and
a housing of metal sheet profiled around at least part of said printed circuit board, said housing extending over said components and having a peripheral area extending substantially around at least one edge of said printed circuit board, wherein said earth foil is soldered along its edge to said peripheral area of said housing;
wherein, said housing and said earth foil form a metallic RF-shield substantially enclosing said components of said printed circuit board.

6. A hybrid circuit according to claim 5, wherein the circuit board has protrusions and at least one edge of said peripheral area of said housing is provided with two or more notches which mate with said protrusions in said printed circuit board in order to fix the position of said printed circuit board in relation to said housing.

7. An RF-shielded hybrid board which comprises:
a printed circuit board of insulating material, said printed circuit board having connectors at at least one edge thereof, and having foils provided on both sides of said printed circuit board, a first foil on one side forming a continuous earth foil, and electrical components and a second foil forming at least one circuit foil on the opposite side of said printed circuit board; and
a housing of metal sheet profiled around at least part of said printed circuit board, said housing extending over said components and having a peripheral area extending substantially around at least one edge of said printed circuit board, wherein said earth foil is soldered along its edge to said peripheral area of said housing;
whereby, said housing and said earth foil form a metallic RF-shield substantially enclosing said components of said printed circuit board.

8. A hybrid circuit according to claim 7, wherein said circuit board has protrusions and at least one edge of said peripheral area of said housing is provided with two or more notches which mate with corresponding protrusions in said printed circuit board in order to fix the position of said printed circuit board in relation to said housing.

9. A hybrid circuit according to claim 7, wherein in the area of said connectors a notch is provided in said peripheral area of said housing, the depth of the notch exceeding the thickness of said printed circuit board.

10. A hybrid circuit according to claim 9, wherein said connectors of said printed circuit board comprise projections in said edge of said printed circuit board, said projections extending beyond said housing and having each on one side said earth foil and on the other side at least one circuit foil.

* * * * *